(12) United States Patent
Suzuki

(10) Patent No.: US 9,761,597 B2
(45) Date of Patent: Sep. 12, 2017

(54) NONVOLATILE SEMICONDUCTOR STORAGE DEVICE, AND METHOD OF MANUFACTURING THE SAME NONVOLATILE SEMICONDUCTOR STORAGE DEVICE

(71) Applicant: Toshiba Memory Corporation, Minato-ku (JP)

(72) Inventor: Ryota Suzuki, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/007,600

(22) Filed: Jan. 27, 2016

(65) Prior Publication Data

US 2017/0069641 A1    Mar. 9, 2017

Related U.S. Application Data

(60) Provisional application No. 62/216,019, filed on Sep. 9, 2015.

(51) Int. Cl.
*H01L 29/788* (2006.01)
*H01L 27/11524* (2017.01)
*H01L 21/28* (2006.01)

(52) U.S. Cl.
CPC .. *H01L 27/11524* (2013.01); *H01L 21/28273* (2013.01)

(58) Field of Classification Search
CPC ............ H01L 21/28273; H01L 29/517; H01L 29/66825; H01L 29/42324; H01L 27/11524; H01L 29/788
USPC ............. 257/315, 316, 310, E21.209, E29.3, 257/E21.422, E29.129
See application file for complete search history.

(56) References Cited

U.S. PATENT DOCUMENTS

| 8,901,633 B2 | 12/2014 | Aoki et al. |
| 2008/0087944 A1 | 4/2008 | Shin et al. |
| 2013/0234224 A1 | 9/2013 | Aoyama |
| 2014/0061756 A1 | 3/2014 | Tanaka et al. |

FOREIGN PATENT DOCUMENTS

| JP | 2008-91929 | 4/2008 |
| JP | 2013-187391 | 9/2013 |
| JP | 2014-53371 | 3/2014 |
| JP | 2014-63883 | 4/2014 |

*Primary Examiner* — Thien F Tran
(74) *Attorney, Agent, or Firm* — Oblon, McClelland, Maier & Neustadt, L.L.P.

(57) ABSTRACT

A nonvolatile semiconductor memory includes an electrically data rewritable or erasable memory cell. The memory cell includes a tunnel insulating film provided on a semiconductor substrate; a floating gate provided on the tunnel insulating film; a first insulating film provided on the floating gate; an interlayer film containing a metal provided on the first insulating film; a second insulating film provided on the interlayer film; a high dielectric constant insulating film provided on the second insulating film; and a gate electrode provided on the high dielectric constant insulating film.

20 Claims, 19 Drawing Sheets

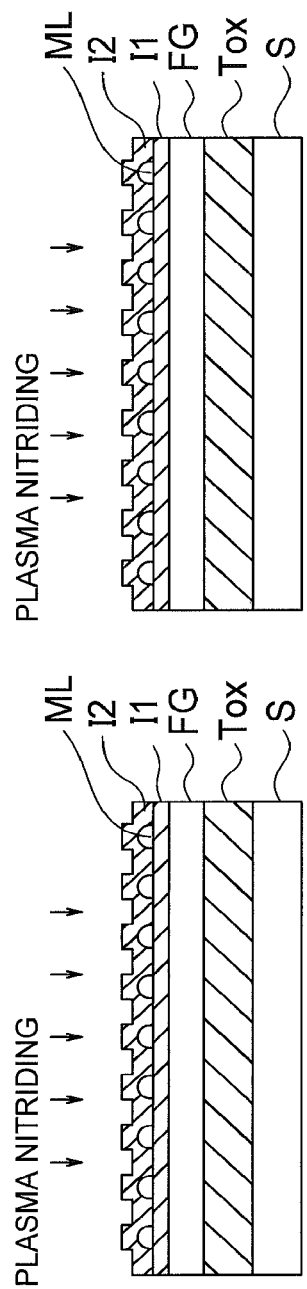

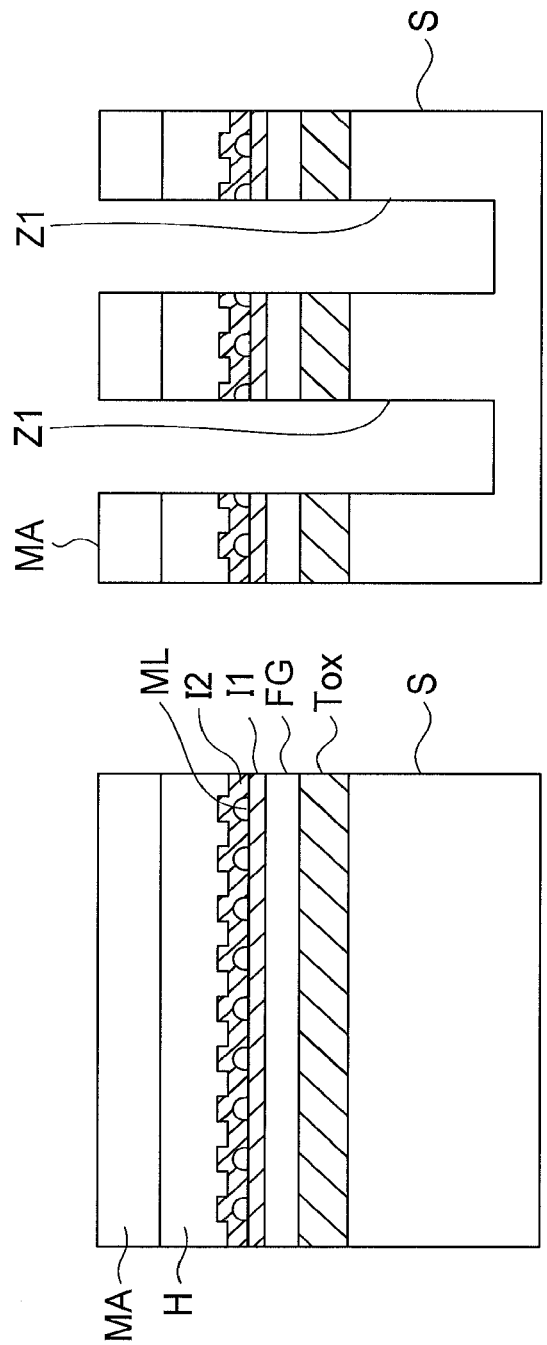

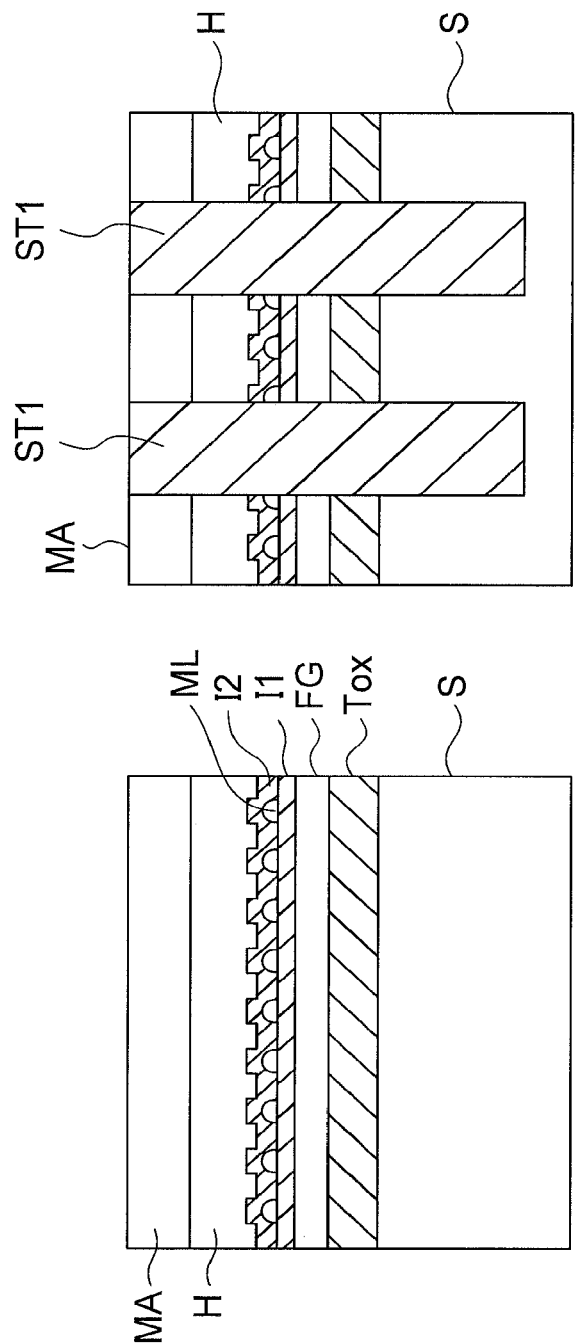

NONVOLATILE SEMICONDUCTOR STORAGE DEVICE, AND METHOD OF MANUFACTURING THE SAME NONVOLATILE SEMICONDUCTOR STORAGE DEVICE

CROSS-REFERENCE TO RELATED APPLICATION

This application is based upon and claims the benefit of U.S. provisional Application No. 62/216,019, filed on Sep. 9, 2015, the entire contents of which are incorporated herein by reference.

FIELD

Embodiments relate to a nonvolatile semiconductor storage device and a method of manufacturing the nonvolatile semiconductor storage device.

BACKGROUND

For NAND flash memory scaling, there is a planer floating gate (FG) cell in which a planer inter-poly insulating film is formed on a thin-film floating gate. To improve the memory capability of the planer FG cell there has been proposed a cell structure in which a metal layer is formed on the thin-film floating gate with an inter floating-gate dielectric (IFD) layer interposed there between.

With this planer FG cell structure, a metal layer of Ru or the like is formed on a floating gate of polysilicon or the like, and an inter-poly insulating film (high dielectric constant insulating film) of HfOx or the like is formed directly on the metal layer. In this case, the metal is diffused to the side of the inter-poly insulating film and to the side of the floating gate/tunnel film.

This leads to degradation of the insulating properties of the inter-poly insulating film or the tunnel insulating film, and poses a problem of reliability degradation of the memory cell.

BRIEF DESCRIPTION OF THE DRAWINGS

FIG. 7A schematically shows cross-sectional structures of the memory cell array 1 of the NAND flash memory 100 shown in FIG. 1 along the bit line "BL1";

FIG. 7B schematically shows cross-sectional structures of the memory cell array 1 of the NAND flash memory 100 shown in FIG. 1 along the word line "WL31";

FIG. 9A schematically shows cross-sectional structures of the memory cell array 1 of the NAND flash memory 100 shown in FIG. 1 along the bit line "BL1";

FIG. 9B schematically shows cross-sectional structures of the memory cell array 1 of the NAND flash memory 100 shown in FIG. 1 along the word line "WL31";

FIG. 10A schematically shows cross-sectional structures of the memory cell array 1 of the NAND flash memory 100 shown in FIG. 1 along the bit line "BL1";

FIG. 10B schematically shows cross-sectional structures of the memory cell array 1 of the NAND flash memory 100 shown in FIG. 1 along the word line "WL31";

DETAILED DESCRIPTION

A nonvolatile semiconductor memory according to an embodiment includes an electrically data rewritable or erasable memory cell. The memory cell includes a tunnel insulating film provided on a semiconductor substrate; a floating gate provided on the tunnel insulating film; a first insulating film provided on the floating gate; an interlayer film containing a metal provided on the first insulating film; a second insulating film provided on the interlayer film; a high dielectric constant insulating film provided on the second insulating film; and a gate electrode provided on the high dielectric constant insulating film.

DETAILED DESCRIPTION OF THE INVENTION

In the following, embodiments will be described with reference to the drawings.

First Embodiment

Figure 1:
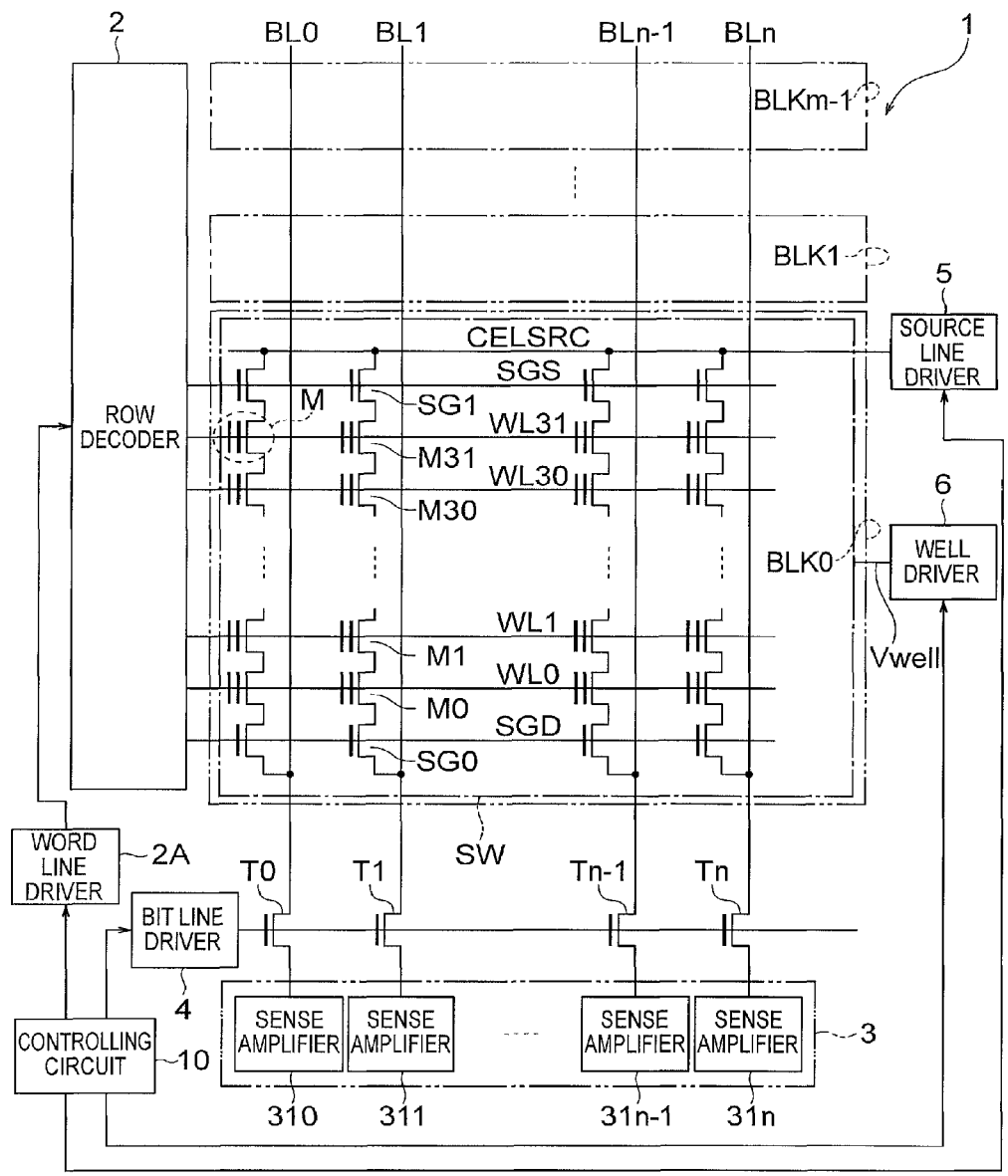
FIG. 1 is a block diagram showing an example of a configuration of a NAND flash memory 100 according to a first embodiment, which is an aspect of the present invention.

FIG. 1 is a block diagram showing an example of a configuration of a NAND flash memory 100 according to a first embodiment, which is an aspect of the present invention.

As shown in FIG. 1, the NAND flash memory (nonvolatile semiconductor storage device) 100 includes a memory cell array 1, a row decoder 2, a word line driver 2A, a sense amplifier circuit 3, a bit line driver 4, a source line driver 5, a well driver 6, a gate driver 20, clamp transistors "T0" to "Tn" ("n" denotes a positive integer), discharge transistors "X0" to "Xn", and a controlling circuit 10.

The memory cell array 1 includes a plurality of bit lines "BL0" to "BLn", a plurality of word lines "WL0" to "WL31", and a source line "CELSRC". The memory cell array 1 is composed of a plurality of NAND cell blocks "BLK0" to "BLKm−1" ("m" denotes a positive integer), each of which includes a matrix arrangement of electrically data rewritable memory cells "M" ("M0" to "M31"), which are formed by EEPROM cells, for example.

A NAND cell unit is composed of a column of a plurality of memory cells (memory cell transistors) "M" ("M0" to "M31") that are connected in series with each other in such a manner that adjacent cells share their source and drain, and select gate transistors "SG0" and "SG1" that are connected to the opposite ends of the series connection of cells.

The memory cell array 1 is composed by a matrix arrangement of such NAND cell units. The NAND cell block "BLK0" to "BLKm−1" described above is composed of a row of NAND cell units. Gates of the select gate transistors "SG0" arranged in the same row are connected to a same select gate line, and control gates of the memory cells "M" arranged in the same row are connected to a same control gate line.

In the example shown in FIG. 1, the memory cell array 1 includes an array of memory strings "MS" each of which is a series connection of 32 electrically data rewritable memory cells "M0" to "M31". Note that the number of memory cells "M" in one memory string "MS" is not limited to 32 but can be 64 or 128, for example.

A drain-side select gate transistor "SG0" and a source-side select gate transistor "SG1", which become conductive when the memory string "MS" is selected, are connected to the opposite ends of the memory string "MS". In the example shown in FIG. 1, the NAND cell unit described above is composed of the 32 memory cells "M0" to "M31" and the two select gate transistors "SG0" and "SG1".

That is, each NAND cell unit is connected to the bit line "BL" ("BL0" to "BLn") at one end of the drain-side select gate transistor "SG0" and to the source line "CELSRC" at one end of the source-side select gate transistor "SG1".

The control gates of the memory cells "M0" to "M31" in the NAND cell unit are connected to different word lines "WL0" to "WL31". The gates of the select gate transistors "SG0" and "SG1" are connected to select gate lines "SGD" and "SGS" that are parallel with the word lines "WL0" to "WL31".

The word lines WL ("WL0" to "WL31") and the select gate lines "SGD" and "SGS" are selectively driven by an output of the word line driver 2A and the row decoder 2.

The bit lines "BL0" to "BLn" are connected to sense amplifiers 310 to 31n in the sense amplifier circuit 3, respectively. In a reading operation, the bit lines "BL0" to "BLn" are charged to a predetermined voltage by a pre-charging circuit (not shown) in the sense amplifiers 310 to 31n. The clamp transistors "T0" to "Tn" are connected between the bit lines "BL" and the sense amplifiers 310 to 31n, and the gate voltages of the clamp transistors "T0" to "Tn" are controlled by the bit line driver 4.

In this example, the bit lines "BL0" to "BLn" are shown as being connected to the sense amplifiers 310 to 31n in a one-to-one relationship. In this case, the memory cells "M" selected by one word line constitute one page of memory cells to be written/read at the same time. Alternatively, an even-numbered bit line and an odd-numbered bit line adjacent to each other may share one sense amplifier. In that case, half of the memory cells selected by one word line constitute a unit (page) of simultaneous writing/reading.

A set of NAND cell units that share one word line constitutes a block that is a unit of data erasure. In the example shown in FIG. 1, a plurality of blocks "BLK0", "BLK1", . . . , "BLKm−1" are arranged in the direction of the bit lines "BL" ("BL0" to "BLn").

As shown in FIG. 1, the sense amplifier circuit 3 that controls the voltage of the bit lines and the row decoder 2 that controls the voltage of the word line are connected to the memory cell array 1. In a data erasure operation, a block is selected by the row decoder 2, and the remaining blocks are left unselected. In accordance with the output of the word line driver 2A controlled by the controlling circuit 10, the row decoder 2 applies a voltage required for reading, writing or erasure to the word line of the memory cell array 1.

The sense amplifier circuit 3 includes the sense amplifiers 310 to 31n.

The sense amplifiers 310 to 31n sense-amplify the voltage of the bit lines "BL0" to "BLn" in the memory cell array 1. The sense amplifiers 310 to 31n include a data latch circuit that latches data to be written.

The sense amplifier circuit 3 reads data from a memory cell "M" in the memory cell array 1 via the bit line "BL", detects the state of the memory cell "M" via the bit line "BL", or writes data to the memory cell "M" by applying a write controlling voltage to the memory cell "M" via the bit line "BL".

Furthermore, a column decoder (not shown) and a data input/output buffer (not shown) are connected to the sense amplifier circuit 3. The column decoder selects from among the data latch circuits in the sense amplifier circuit 3. The data of the memory cell transistor is read from the selected data latch circuit and output to the outside via the data input/output buffer (not shown).

Externally input data to be written is stored in the data latch circuit selected by the column decoder via the data input/output buffer (not shown).

As described above, the source line driver 5 is connected to the memory cell array 1. The source line driver 5 is configured to control the voltage of the source line "CELSRC".

As described above, the well driver 6 is connected to the memory cell array 1. The well driver 6 is configured to control the voltage of a semiconductor substrate (well SW) on which the memory cells "M" are formed.

The controlling circuit 10 performs a controlling operation in response to a controlling signal (a command latch enable signal, an address latch enable signal, a ready/busy signal or the like) and a command that are externally input. That is, the controlling circuit 10 produces a desired voltage and supplies the voltage to each part of the memory cell array 1 in response to the controlling signal and the command, when programming, verifying, reading or erasing data.

That is, the controlling circuit 10 controls the gate driver 20, the word line driver 2A, the bit line driver 4, the source line driver 5 and the well driver 6, thereby controlling the voltage applied to the gate line, the word lines "WL0" to "WLn", the bit lines "BL0" to "BLn", the source line "CELSRC" and the well SW.

Figure 2A:
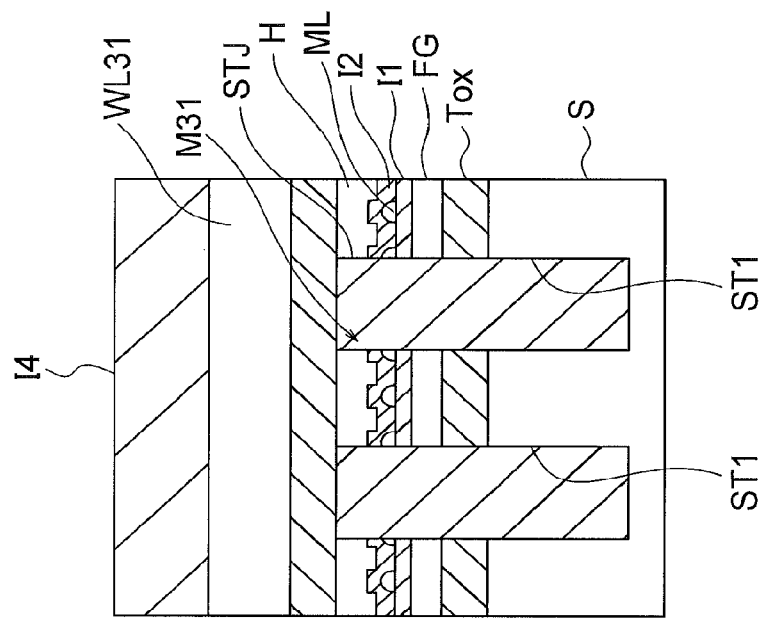
FIG. 2A schematically shows a cross-sectional structure of the memory cell array 1 of the NAND flash memory 100 shown in FIG. 1 along the bit line "BL1"
Figure 2B:
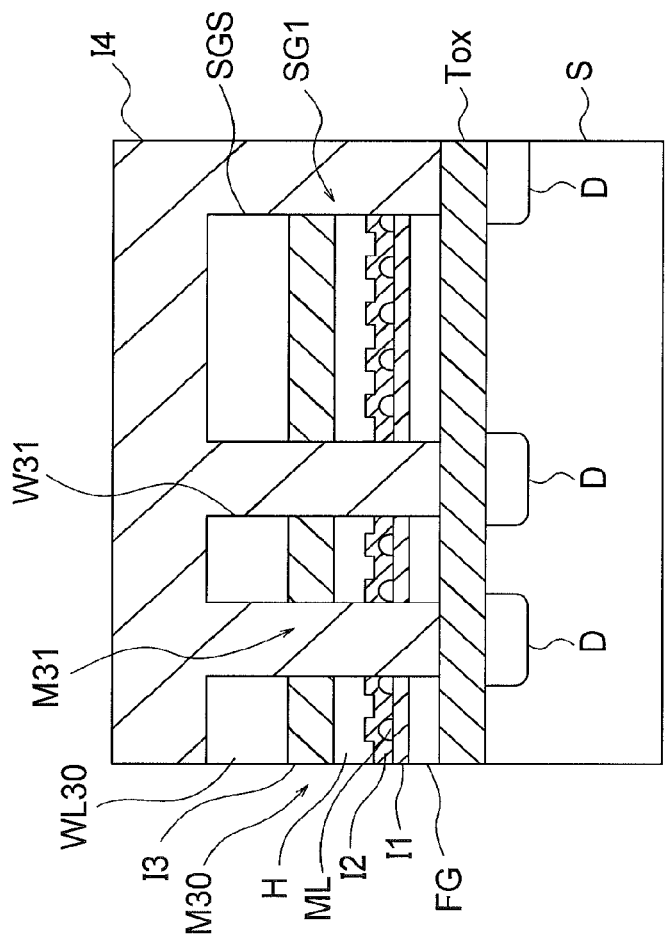
FIG. 2B schematically shows a cross-sectional structure of the memory cell array 1 of the NAND flash memory 100 shown in FIG. 1 along the word line "WL31"
Figure 3B:
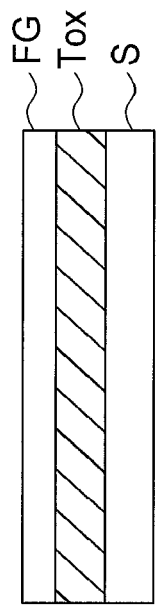
FIG. 3B schematically shows cross-sectional structures of the memory cell array 1 of the NAND flash memory 100 shown in FIG. 1 along the word line "WL31"
Figure 3A:
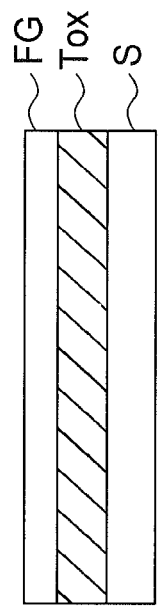
FIG. 3A schematically shows cross-sectional structures of the memory cell array 1 of the NAND flash memory 100 shown in FIG. 1 along the bit line "BL1"

FIG. 2 are schematic cross-sectional views showing a cross section of the memory cell array 1 of the NAND flash memory 100 shown in FIG. 1. FIG. 2A schematically shows a cross-sectional structure of the memory cell array 1 of the NAND flash memory 100 shown in FIG. 1 along the bit line "BL1". FIG. 2(B) schematically shows a cross-sectional structure of the memory cell array 1 of the NAND flash memory 100 shown in FIG. 1 along the word line "WL31".

As shown in FIG. 2, a gate insulating film (tunnel insulating film) "Tox" is formed on a semiconductor substrate "S". The gate insulating film "Tox" is a silicon oxide film, for example, and is formed on an upper surface of the semiconductor substrate "S" in a region where the memory cells "M30" and "M31" and the select gate transistor "SG1" are to be formed. Note that the gate insulating film "Tox" is identical with the tunnel insulating film of the memory cells "M30" and "M31" (the gate insulating film is sometimes referred to as a tunnel insulating film in the following description of the memory cells "M30" and "M31").

As shown in FIG. 2, the memory cells "M30" and "M31" have a cell structure including the gate insulating film (tunnel insulating film) "Tox" provided on the semiconductor substrate "S", a stacked gate electrode (stack structure) provided on the tunnel insulating film "Tox", and a diffusion layer (referred to as a source/drain region, hereinafter) "D" that is provided in the semiconductor substrate "S" and serves as a source region and a drain region positioned on the opposite sides of the stacked gate electrode described above, for example.

The stacked gate electrode (stack structure) includes a floating gate "FG" provided on the gate insulating film (tunnel insulating film) "Tox", a first insulating film "I1" provided on the floating gate "FG", an interlayer film "ML" containing a metal provided on the first insulating film "I1", a second insulating film "I2" provided on the interlayer film "ML", a high dielectric constant insulating film "H" (third insulating film "I3") provided on the second insulating film "I2", and a gate electrode (word lines "WL30" and "WL31") provided on the high dielectric constant insulating film "H" (third insulating film "I3").

The interlayer film "ML" is a metal layer containing a metal as a main constituent or a silicide layer containing a metal silicide. The metal may be any of tungsten, ruthenium, iridium, titanium, or tantalum, for example. The metal layer "ML" has the shape of a sheet or nano dots, for example.

The floating gate "FG" is an amorphous silicon film or a polycrystal silicon film containing silicon as a main constituent, for example.

The high dielectric constant insulating film "H" is an oxide film containing hafnium as a main constituent, for example.

The first insulating film "I1" is a silicon nitride film or an aluminum oxide film. The second insulating film "I2" is a silicon nitride film or a silicon oxide film.

The source/drain region "D" is formed in a surface layer of the silicon substrate "S" at positions on the opposite sides of the floating gate "FG".

As shown in FIG. 2, a fourth insulating film "I4", which is an interlayer insulating film, is formed on the stacked gate electrode, the select gate electrode "SG1" and the source/drain region "D" described above.

In this embodiment, as described above, the interlayer film "ML" containing a metal for improving the capability of the memory cell is disposed between the first insulating film "I1" and the second insulating film "I2".

As a result, as described later, the metal in the interlayer film "ML" can be prevented from being diffused into the high dielectric constant insulating film "H" (third insulating film "I3"), and the trap level of the high dielectric constant insulating film "H" (third insulating film "I3") can be reduced. In addition, the leak current and the charge retention characteristics of the high dielectric constant insulating film "H" in the memory cell can be improved.

The select gate transistor "SG1" has substantially the same structure as the memory cells "M30" and "M31".

Next, an example of a method of manufacturing the NAND flash memory 100 having the configuration and functionality described above will be described. The following description of this embodiment will be focused mainly on characteristic parts thereof. However, any common step may be added between steps, or any step may be omitted, as required. The order of steps may be changed as required, as far as it is practically feasible.

FIGS. 3 to 16 are cross-sectional views for illustrating steps of a method of manufacturing the NAND flash memory 100 shown in FIGS. 1 and 2. FIGS. 3A to 16A schematically show cross-sectional structures of the memory cell array 1 of the NAND flash memory 100 shown in FIG. 1 along the bit line "BL1". FIGS. 3(B) to 16(B) schematically show cross-sectional structures of the memory cell array 1 of the NAND flash memory 100 shown in FIG. 1 along the word line "WL31".

First, as shown in FIG. 3, ion implantation for well region formation is performed on the silicon substrate (semiconductor substrate) "S", and the tunnel oxide film (tunnel insulating film) "Tox" is then formed on the silicon substrate "S". The amorphous silicon film (having a thickness of approximately 5 nm to 10 nm, for example) "FG" that serves as the floating gate is then formed on the tunnel oxide film "Tox".

Figure 4A:
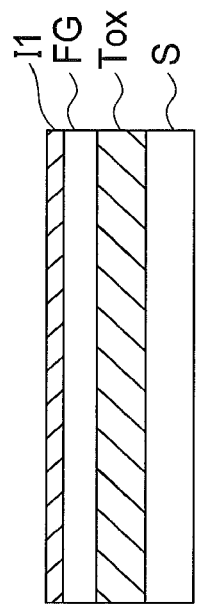
FIG. 4A schematically shows cross-sectional structures of the memory cell array 1 of the NAND flash memory 100 shown in FIG. 1 along the bit line "BL1"
Figure 4B:
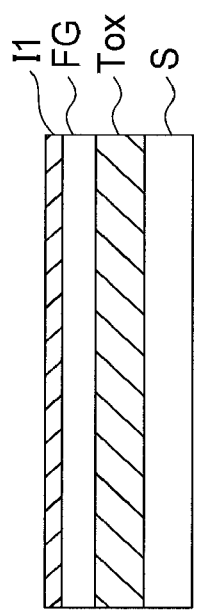
FIG. 4B schematically shows cross-sectional structures of the memory cell array 1 of the NAND flash memory 100 shown in FIG. 1 along the word line "WL31"

As shown in FIG. 4, the first insulating film "I1" having a thickness of approximately 1 nm to 2 nm is then deposited on the amorphous silicon film (floating gate) "FG".

For example, the first insulating film "I1" may be a nitride film or an aluminum oxide film formed by low pressure chemical vapor deposition (LP-CVD) or atomic layer deposition (ALD), or a nitride film formed by plasma nitriding of the surface of the amorphous silicon film "FG" described above. Alternatively, the first insulating film "I1" may be formed by plasma nitriding of an oxide film on the amorphous silicon film (floating gate) "FG" formed by LP-CVD, ALD or rapid thermal oxidation (RTO).

Figure 5B:
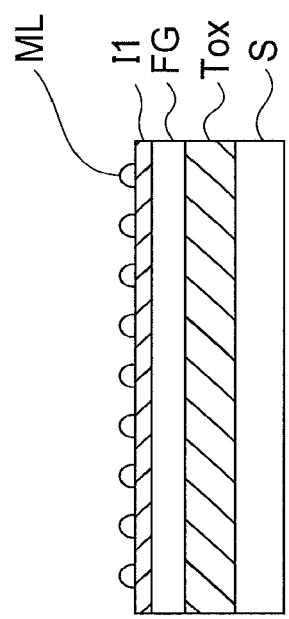
FIG. 5B schematically shows cross-sectional structures of the memory cell array 1 of the NAND flash memory 100 shown in FIG. 1 along the word line "WL31"
Figure 5A:
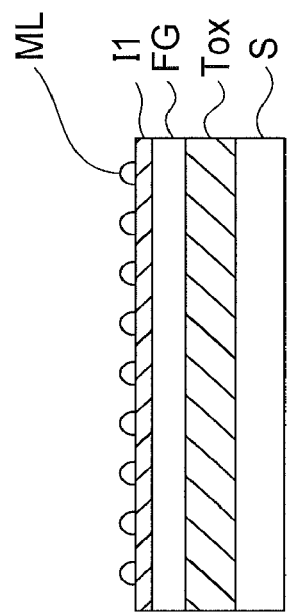
FIG. 5A schematically shows cross-sectional structures of the memory cell array 1 of the NAND flash memory 100 shown in FIG. 1 along the bit line "BL1"

As shown in FIG. 5, the metal layer "ML" containing a metal is then formed on the first insulating film "I1" by physical vapor deposition (PVD), ALD or the like. In particular, the metal layer "ML" is formed on the first insulating film "I1" in the shape of a sheet or nano dots. As the metal material in the metal layer "ML", at least one is selected from among transition metal elements including tungsten, ruthenium, iridium, titanium, tantalum and the like.

The metal layer "ML" may be a silicide (RuSi, TaSi or the like) or a nitride film (TiN or the like) of any of the metal materials described above.

Figure 6A:
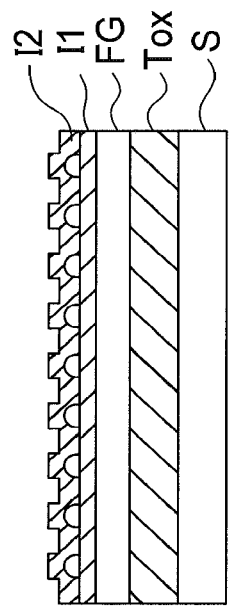
FIG. 6A schematically shows cross-sectional structures of the memory cell array 1 of the NAND flash memory 100 shown in FIG. 1 along the bit line "BL1"
Figure 6B:
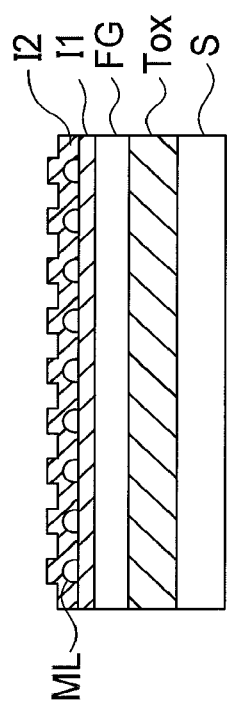
FIG. 6B schematically shows cross-sectional structures of the memory cell array 1 of the NAND flash memory 100 shown in FIG. 1 along the word line "WL31"

As shown in FIG. 6, the second insulating film "I2", which is an oxide film, a nitride film or the like, is then formed on the metal layer "ML" by chemical vapor deposition (CVD). The nitride film of the second insulating film "I2" may be formed by plasma nitriding of an amorphous silicon film or an oxide film formed on the ML (FIG. 7).

In this way, a structure in which the metal layer "ML" is disposed between the first insulating film "I1" and the second insulating film "I2" is formed.

Figure 8B:
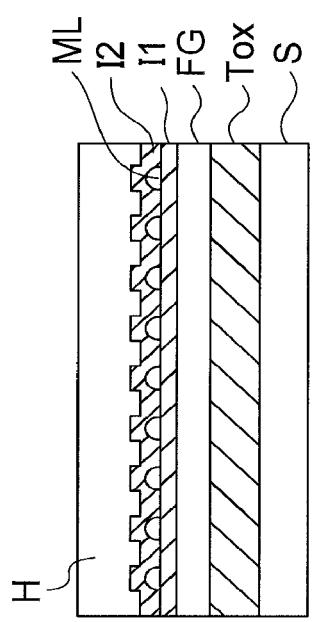
FIG. 8B schematically shows cross-sectional structures of the memory cell array 1 of the NAND flash memory 100 shown in FIG. 1 along the word line "WL31"
Figure 8A:
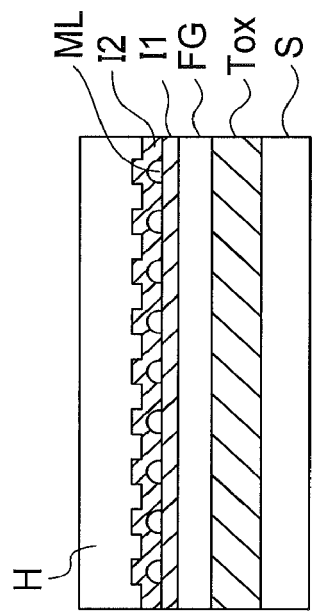
FIG. 8A schematically shows cross-sectional structures of the memory cell array 1 of the NAND flash memory 100 shown in FIG. 1 along the bit line "BL1"

As shown in FIG. 8, the high dielectric constant insulating film (inter-poly insulating film) "H" containing hafnium as a main constituent, for example, is then formed on the second insulating film "I2". For example, the high dielectric constant insulating film "H" is formed as a single-layer film of a high dielectric constant material or a multilayer film including a low dielectric constant layer, such as an oxide layer.

As shown in FIG. 9, a hard mask "MA" is then selectively formed on the high dielectric constant insulating film "H". To form a device isolation insulating film "STI" that insulates active regions of the memory cell array 1 from each other, a shallow trench isolation (STI) groove "Z1" that reaches the silicon substrate "S" is formed by etching the high dielectric constant insulating film "H", the second insulating film "I2", the metal layer "ML", the first insulating film "I1", the amorphous silicon film "FG", the tunnel oxide film "Tox" and the silicon substrate "S" by RIE, for example, using this hard mask "MA" as a mask.

As shown in FIG. 10, a silicon oxide film is then buried in the STI groove "Z1" and planarized by chemical mechanical polishing (CMP) to form the device isolation insulating film "STI".

Figure 11B:
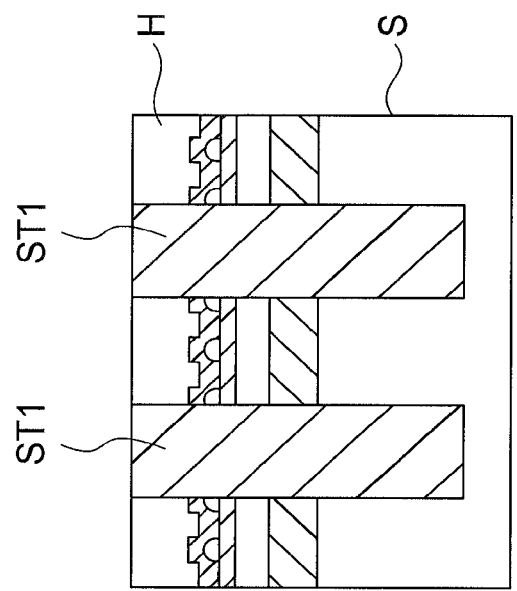
FIG. 11B schematically shows cross-sectional structures of the memory cell array 1 of the NAND flash memory 100 shown in FIG. 1 along the word line "WL31"
Figure 11A:
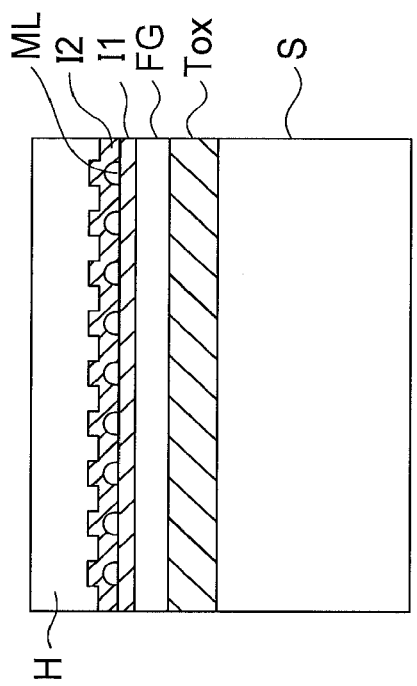
FIG. 11A schematically shows cross-sectional structures of the memory cell array 1 of the NAND flash memory 100 shown in FIG. 1 along the bit line "BL1"

As shown in FIG. 11, the top part of the resulting structure is then etched back to the upper surface of the device isolation insulating film "STI" to remove the hard mask "MA".

Figures 12A, 12B:
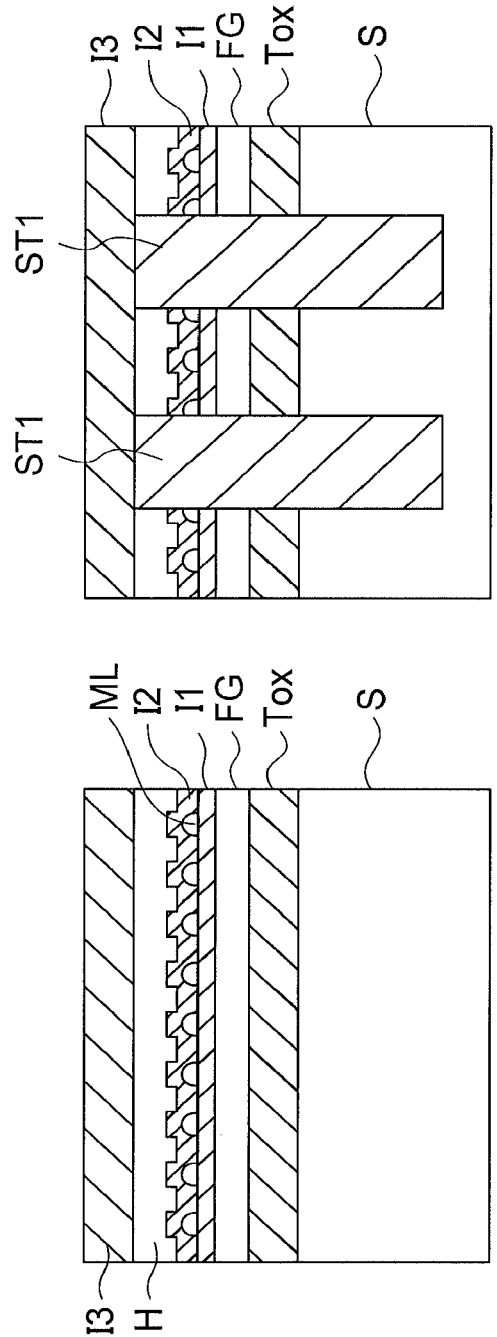
FIG. 12A schematically shows cross-sectional structures of the memory cell array 1 of the NAND flash memory 100 shown in FIG. 1 along the bit line "BL1"
FIG. 12B schematically shows cross-sectional structures of the memory cell array 1 of the NAND flash memory 100 shown in FIG. 1 along the word line "WL31"

As shown in FIG. 12, the third insulating film "I3" serving as a block film is then formed on the high dielectric constant insulating film "H" and the device isolation insulating film "STI". The third insulating film may include the high dielectric constant insulating film "H".

Figure 13A:
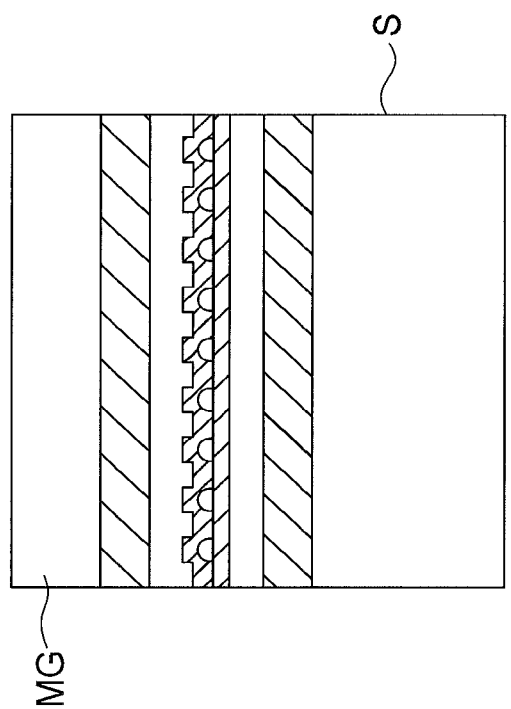
FIG. 13A schematically shows cross-sectional structures of the memory cell array 1 of the NAND flash memory 100 shown in FIG. 1 along the bit line "BL1"
Figure 13B:
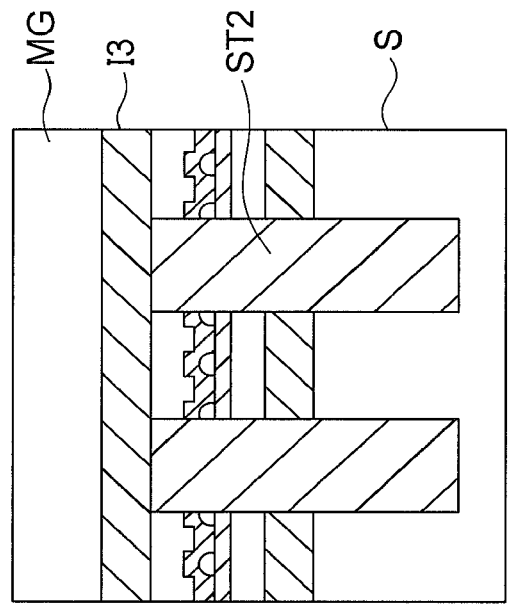
FIG. 13B schematically shows cross-sectional structures of the memory cell array 1 of the NAND flash memory 100 shown in FIG. 1 along the word line "WL31"

As shown in FIG. 13, a metal film "MG" serving as a gate electrode (a word line, or a select gate line) is then formed on the third insulating film "I3". The metal film "MG" contains a metal-containing material, such as TiN, TaN, W, Ni or Co, and a silicide thereof.

Figure 14B:
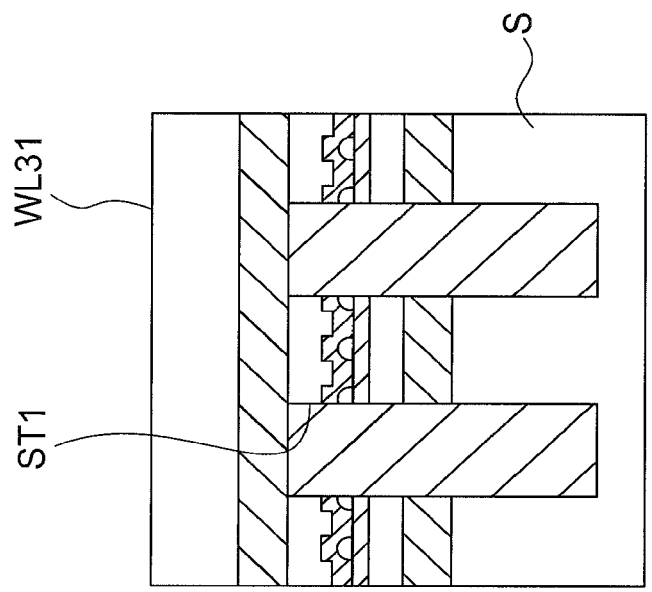
FIG. 14B schematically shows cross-sectional structures of the memory cell array 1 of the NAND flash memory 100 shown in FIG. 1 along the word line "WL31"
Figure 14A:
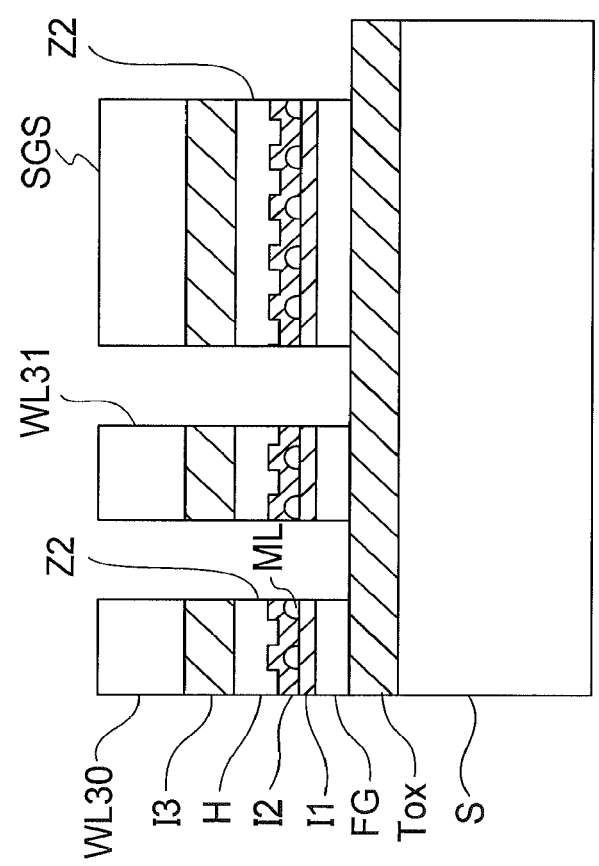
FIG. 14A schematically shows cross-sectional structures of the memory cell array 1 of the NAND flash memory 100 shown in FIG. 1 along the bit line "BL1"

As shown in FIG. 14, the metal film "MG", the third insulating film "I3", the high dielectric constant insulating film "H", the second insulating film "I2", the metal layer "ML", the first insulating film "I1" and the amorphous silicon film "FG" are then selectively etched by RIE or the like to form a groove "Z2" that reaches the tunnel oxide film "Tox". In this way, the word lines "WL30" and "WL31" and the select gate line "SG1" are formed. In other words, the stack structure of the memory cell and the stack structure of the select gate transistor are separated from each other.

Figure 15B:
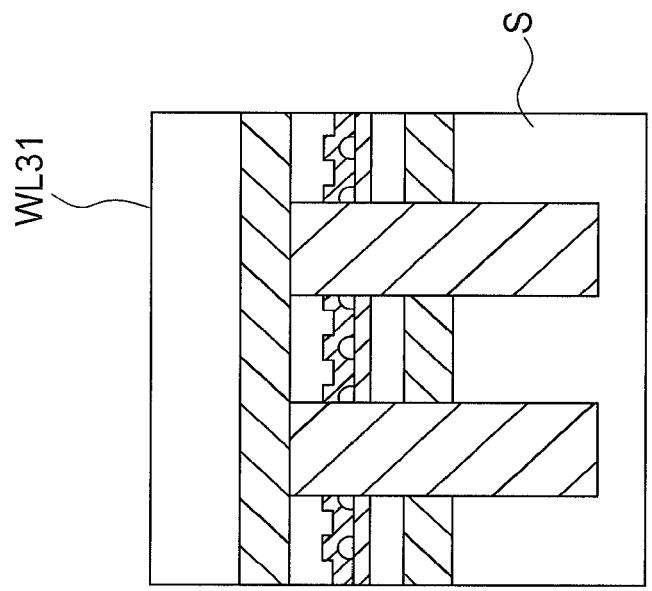
FIG. 15B schematically shows cross-sectional structures of the memory cell array 1 of the NAND flash memory 100 shown in FIG. 1 along the word line "WL31"
Figure 15A:
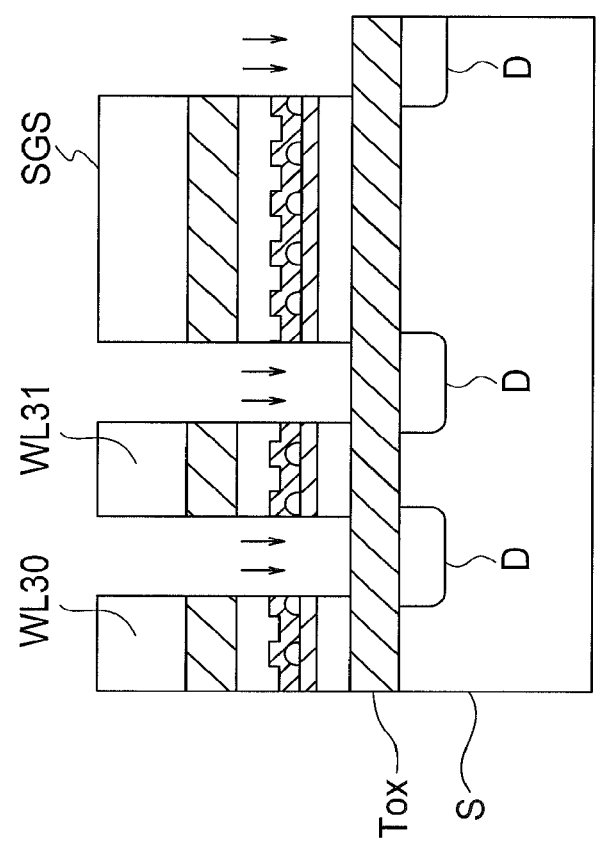
FIG. 15A schematically shows cross-sectional structures of the memory cell array 1 of the NAND flash memory 100 shown in FIG. 1 along the bit line "BL1"
Figure 16B:
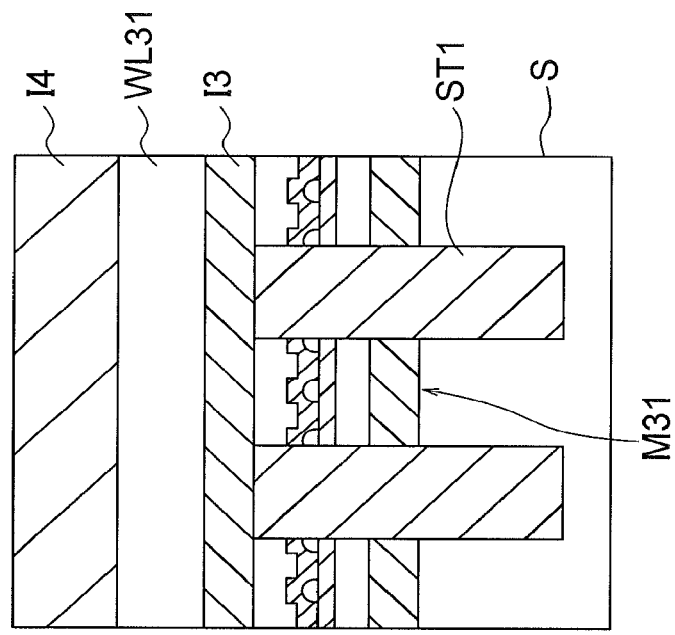
FIG. 16B schematically shows cross-sectional structures of the memory cell array 1 of the NAND flash memory 100 shown in FIG. 1 along the word line "WL31"
Figure 16A:
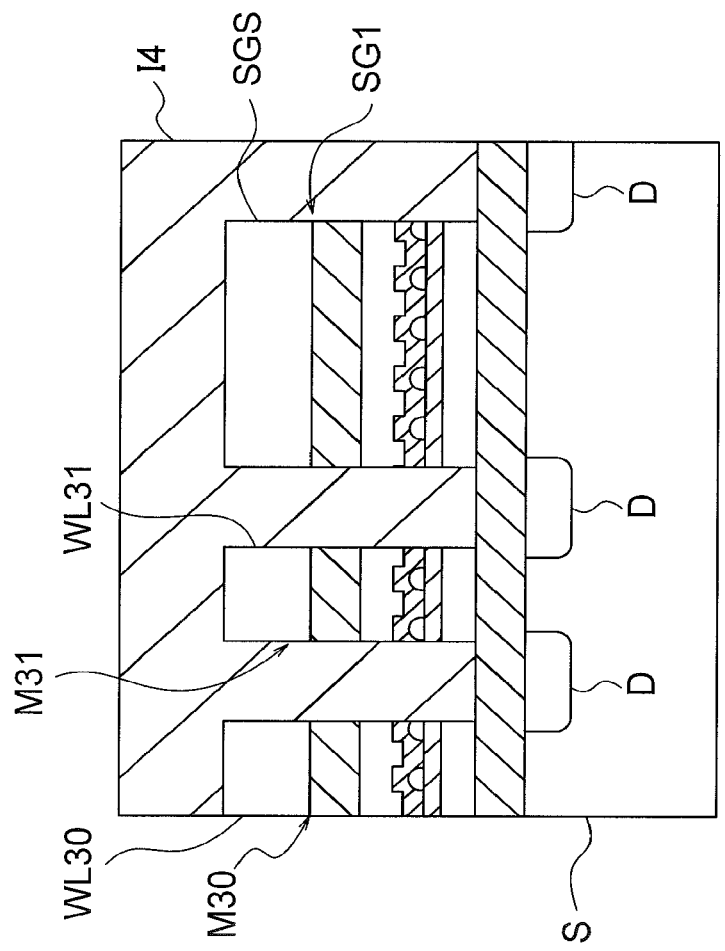
FIG. 16A schematically shows cross-sectional structures of the memory cell array 1 of the NAND flash memory 100 shown in FIG. 1 along the bit line "BL1"

As shown in FIG. 15, ion implantation is then performed to implant an impurity into the silicon substrate "S" through the tunnel oxide film "Tox" from above the groove "Z2". In this way, a diffusion layer "D" is formed in the surface of the silicon substrate "S" between adjacent memory cells and between the memory cell and the select gate transistor.

As shown in FIG. 16, the fourth insulating film "I4" is then formed to bury the spaces between adjacent memory cells and between the memory cell and the select gate transistor. In this way, the structure of the memory cell shown in FIG. 2 described above is completed.

After the step shown in FIG. 16, a wiring step is performed to form contact wiring and other wiring including the source line "CELSRC", the bit lines "BL" and the like. In this way, the NAND flash memory 100 shown in FIG. 1 described above is completed.

As described above, in the NAND flash memory 100, the interlayer film "ML" containing a metal is disposed between the first insulating film "I1" and the second insulating film "I2".

As a result, the metal in the interlayer film "ML" can be prevented from being diffused into the high dielectric constant insulating film "H" (third insulating film "I3"), and the trap level of the high dielectric constant insulating film "H" (third insulating film "I3") can be reduced. In addition, the leak current and the charge retention characteristics of the high dielectric constant insulating film "H" in the memory cell can be improved.

As can be seen from the above description, with the nonvolatile semiconductor storage device according to this embodiment, diffusion of the metal in the metal layer of the memory cell can be prevented, thereby preventing degradation of the reliability of the memory cell.

Second Embodiment

With regard to a second embodiment, another example of the method of manufacturing the nonvolatile semiconductor storage device will be described. In particular, the description of this embodiment will be focused on the stack structure of the memory cell.

Figure 18:
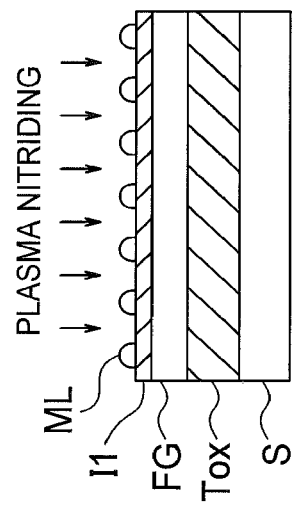
FIG. 18 is a cross-sectional view for illustrating step of the method of manufacturing the NAND flash memory 100 shown in FIG. 1.
Figure 17:
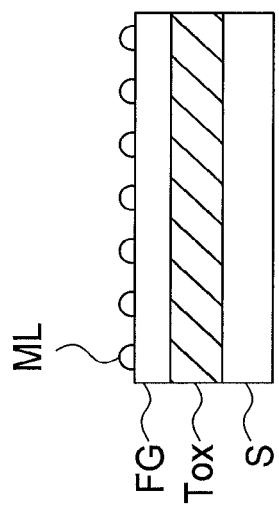
FIG. 17 is a cross-sectional view for illustrating step of the method of manufacturing the NAND flash memory 100 shown in FIG. 1.

FIGS. 17 and 18 are cross-sectional views for illustrating steps of the method of manufacturing the NAND flash memory 100 shown in FIGS. 1 and 2. FIGS. 17 and 18 schematically show cross-sectional structures of the memory cell of the NAND flash memory 100 shown in FIG. 1 along the bit line "BL1". In FIGS. 17 and 18, the same reference symbols as those in FIG. 3 denote the same components as those in the first embodiment.

First, as in the first embodiment, in the step shown in FIG. 3 described above, ion implantation for well region formation is performed on the silicon substrate (semiconductor substrate) "S", and the tunnel oxide film (tunnel insulating film) "Tox" is then formed on the silicon substrate "S". After that, the amorphous silicon film "FG" that serves as the floating gate is formed on the tunnel oxide film "Tox".

As shown in FIG. 17, the metal layer (interlayer film) "ML" is then formed on the amorphous silicon film (floating gate) "FG" by PVD, ALD or the like. In particular, the metal layer "ML" is formed on the amorphous silicon film (floating gate) "FG" in the shape of nano dots.

As shown in FIG. 18, the first insulating film "I1" is then formed on the amorphous silicon film (floating gate) "FG" (below the metal layer (interlayer film) "ML") by plasma nitriding of an upper part of the amorphous silicon film "FG".

After that, as in the first embodiment, the steps shown in FIGS. 5 to 16 are performed to complete the memory cell of the NAND flash memory 100.

The configuration of the NAND flash memory 100 according to this embodiment is the same as that in the first embodiment.

That is, with the NAND flash memory according to the second embodiment, as with the nonvolatile semiconductor storage device according to the first embodiment, diffusion of the metal in the metal layer of the memory cell can be prevented, thereby preventing deterioration of the reliability of the memory cell.

Third Embodiment

With regard to a third embodiment, another example of the method of manufacturing the nonvolatile semiconductor storage device will be described. In particular, the description of this embodiment will be focused on the stack structure of the memory cell.

Figure 19:
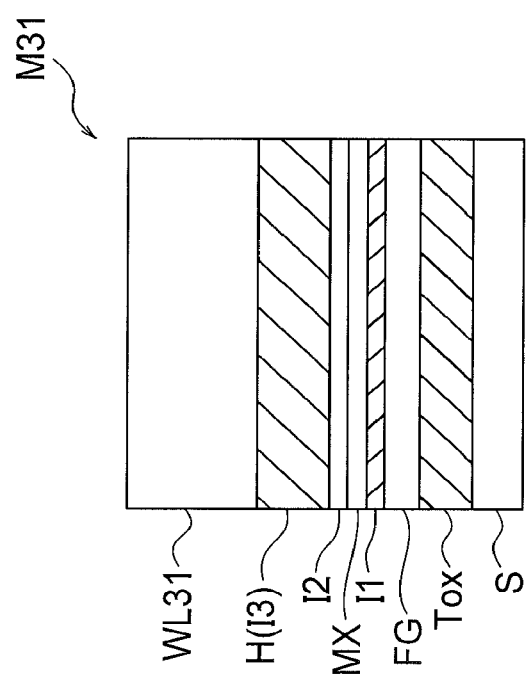
FIG. 19 is a cross-sectional view schematically showing a cross-sectional structure of the memory cell "M31" of the NAND flash memory 100 shown in FIG. 1 along the bit line "BL1"

FIG. 19 is a cross-sectional view schematically showing a cross-sectional structure of the memory cell "M31" of the NAND flash memory 100 shown in FIG. 1 along the bit line "BL1". Note that the other memory cells "M0" to "M30" have the same configuration as the memory cell "M31".

As shown in FIG. 19, the memory cell "M31" includes the tunnel insulating film "Tox" provided on the semiconductor substrate "S", the floating gate "FG" provided on the tunnel insulating film "Tox", the first insulating film "I1" provided on the floating gate "FG", an interlayer film (silicide layer "MX") containing a metal provided on the first insulating film "I1", the second insulating film "I2" provided on the interlayer film (silicide layer "MX"), the high dielectric constant insulating film "H" (third insulating film "I3") provided on the second insulating film "I2", and the gate electrode (word line "WL31") provided on the high dielectric constant insulating film (third insulating film "I3").

This embodiment differs from the first and second embodiments in that the interlayer film containing a metal disposed between the first insulating film "I1" and the second insulating film "I2" is a silicide layer "MX". The silicide layer "MX" is formed by silicidation of a transition metal element, such as tungsten, ruthenium, iridium, titanium or tantalum.

Next, an example of the method of manufacturing the NAND flash memory 100 having the configuration and functionality described above will be described.

Figure 20:
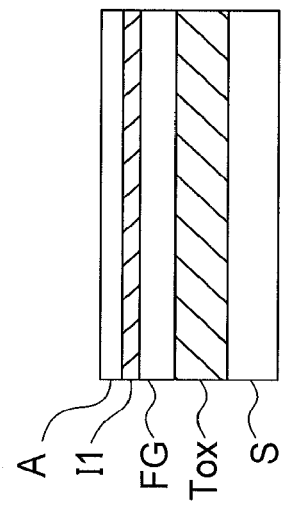
FIG. 20 is a cross-sectional views for illustrating steps of a method of manufacturing the NAND flash memory including the memory cell shown in FIG. 19.
Figure 22:
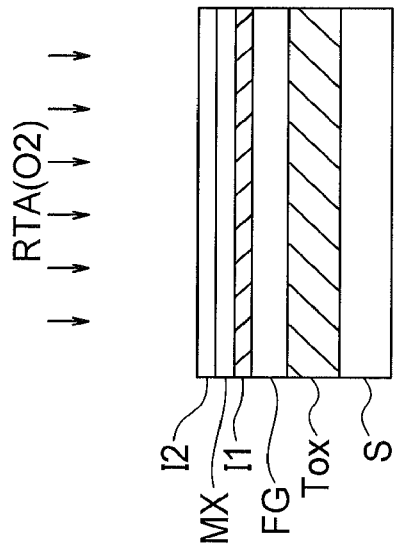
FIG. 22 is a cross-sectional views for illustrating steps of a method of manufacturing the NAND flash memory including the memory cell shown in FIG. 19.
Figure 21:
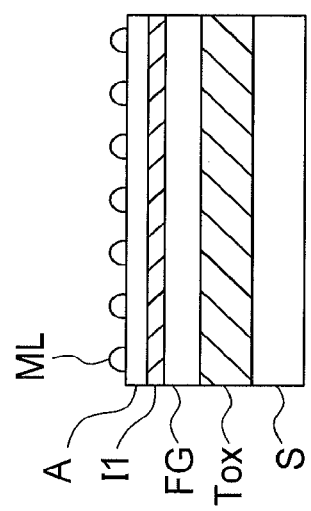
FIG. 21 is a cross-sectional views for illustrating steps of a method of manufacturing the NAND flash memory including the memory cell shown in FIG. 19.

FIGS. 20 to 22 are cross-sectional views for illustrating steps of a method of manufacturing the NAND flash memory including the memory cell shown in FIG. 19. FIGS. 20 to 22 schematically show cross-sectional structures of the memory cell of the NAND flash memory 100 shown in FIG. 1 along the bit line "BL1". In FIGS. 20 to 22, the same reference symbols as those in FIG. 4 denote the same components as those in the first embodiment.

First, as in the first embodiment, in the step shown in FIG. 4 described above, the first insulating film "I1" is deposited on the amorphous silicon film (floating gate) "FG".

As shown in FIG. 20, an amorphous silicon layer "A" is then formed on the first insulating film "I1".

As shown in FIG. 21, the metal layer "ML" containing a metal is then formed on the amorphous silicon layer "A" by PVD, ALD or the like. In particular, the metal layer "ML" is formed on the first insulating film "I1" in the shape of a sheet or nano dots.

As shown in FIG. 22, silicidation of the metal layer "ML" by an annealing processing in an O2 atmosphere is then performed to form the silicide layer "MX", and the second insulating film (oxide film layer) "I2" is formed on the silicide layer "MX".

After that, the high dielectric constant insulating film "H" containing hafnium as a main constituent is formed as the third insulating film "I3", and the gate electrode is formed on the high dielectric constant insulating film "H".

After that, as in the first embodiment, the steps shown in FIGS. 12 to 16 are performed to complete the memory cell of the NAND flash memory 100.

The configuration of the NAND flash memory 100 according to this embodiment is the same as that in the first embodiment. That is, the interlayer film (silicide layer "MX") containing a metal is disposed between the first insulating film "I1" and the second insulating film "I2". In addition, the metal exists in the form of a metal silicide.

As a result, the metal in the silicide layer "MX" can be prevented from being diffused into the high dielectric constant insulating film "H" (third insulating film "I3"), and the trap level of the high dielectric constant insulating film "H" (third insulating film "I3") can be reduced. In addition, the leak current and the charge retention characteristics of the high dielectric constant insulating film "H" in the memory cell can be improved.

That is, with the nonvolatile semiconductor storage device according to the third embodiment, as with the nonvolatile semiconductor storage device according to the first embodiment, diffusion of the metal in the metal layer of the memory cell can be prevented, thereby preventing deterioration of the reliability of the memory cell.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device comprising an electrically data rewritable or erasable memory cell, wherein the memory cell comprises:
   a tunnel insulating film provided on a semiconductor substrate;
   a floating gate provided on the tunnel insulating film;
   a first insulating film provided on the floating gate;
   an interlayer film containing a metal provided on the first insulating film;
   a second insulating film provided on the interlayer film;
   a high dielectric constant insulating film provided on the second insulating film; and
   a gate electrode provided on the high dielectric constant insulating film,
   wherein the interlayer film has the shape of dots.

2. The nonvolatile semiconductor storage device according to claim 1, wherein the interlayer film is a metal layer containing a metal as a main constituent or a silicide layer formed by silicidation of the metal.

3. The nonvolatile semiconductor storage device according to claim 2, wherein the metal is any of tungsten, ruthenium, iridium, titanium and tantalum.

4. The nonvolatile semiconductor storage device according to claim 1, wherein the floating gate contains silicon as a main constituent.

5. The nonvolatile semiconductor storage device according to claim 1, wherein the floating gate is an amorphous silicon film or a polycrystal silicon film.

6. The nonvolatile semiconductor storage device according to claim 1, wherein the high dielectric constant insulating film contains hafnium as a main constituent.

7. The nonvolatile semiconductor storage device according to claim 1, wherein the first insulating film is a silicon nitride film or an aluminum oxide film.

8. The nonvolatile semiconductor storage device according to claim 1, wherein the second insulating film is a silicon nitride film or a silicon oxide film.

9. The nonvolatile semiconductor storage device according to claim 1, wherein the nonvolatile semiconductor storage device is a NAND flash memory.

10. The nonvolatile semiconductor storage device according to claim 1, wherein the interlayer film is a silicide.

11. A method of manufacturing a nonvolatile semiconductor storage device comprising an electrically data rewritable or erasable memory cell, the method comprising:
    forming a tunnel insulating film on a semiconductor substrate;
    forming a floating gate on the tunnel insulating film;
    forming a first insulating film on the floating gate and an interlayer film containing a metal on the first insulating film;
    forming a second insulating film on the interlayer film;
    forming a high dielectric constant insulating film on the second insulating film; and
    forming a gate electrode on the high dielectric constant insulating film,
    wherein the interlayer film has the shape of dots.

12. The method of manufacturing a nonvolatile semiconductor storage device according to claim 11, wherein the floating gate contains silicon as a main constituent.

13. The method of manufacturing a nonvolatile semiconductor storage device according to claim 11, wherein the floating gate is an amorphous silicon film or a polycrystal silicon film.

14. The method of manufacturing a nonvolatile semiconductor storage device according to claim 11, wherein the high dielectric constant insulating film contains hafnium as a main constituent.

15. The method of manufacturing a nonvolatile semiconductor storage device according to claim 11, wherein the first insulating film is a silicon nitride film or an aluminum oxide film.

16. The method of manufacturing a nonvolatile semiconductor storage device according to claim 11, wherein the second insulating film is a silicon nitride film or a silicon oxide film.

17. The method of manufacturing a nonvolatile semiconductor storage device according to claim 11, wherein the nonvolatile semiconductor storage device is a NAND flash memory.

18. The method of manufacturing a nonvolatile semiconductor storage device according to claim 11, wherein the interlayer film is a silicide.

19. A method of manufacturing a nonvolatile semiconductor storage device comprising an electrically data rewritable or erasable memory cell, the method comprising:
    forming a tunnel insulating film on a semiconductor substrate;
    forming a floating gate on the tunnel insulating film;
    forming a first insulating film on the floating gate;
    forming an amorphous silicon layer on the first insulating film;
    forming a metal layer containing a metal on the amorphous silicon layer;
    forming a silicide layer by silicidation of the metal layer by an annealing processing and forming a second insulating film on the silicide layer;
    forming a high dielectric constant insulating film on the second insulating film; and
    forming a gate electrode on the high dielectric constant insulating film.

20. The method of manufacturing a nonvolatile semiconductor storage device according to claim 19, wherein the metal is any of tungsten, ruthenium, iridium, titanium and tantalum.

* * * * *